(12) United States Patent
Yuan et al.

(10) Patent No.: US 12,416,866 B2
(45) Date of Patent: Sep. 16, 2025

(54) OVERLAY MARK

(71) Applicant: United Semiconductor (Xiamen) Co., Ltd., Fujian (CN)

(72) Inventors: Xia Yuan, Fujian (CN); Cheng Hua Wu, Fujian (CN); Wen Yi Tan, Fujian (CN)

(73) Assignee: United Semiconductor (Xiamen) Co., Ltd., Fujian (CN)

( * ) Notice: Subject to any disclaimer, the term of this patent is extended or adjusted under 35 U.S.C. 154(b) by 748 days.

(21) Appl. No.: 17/824,909

(22) Filed: May 26, 2022

(65) Prior Publication Data

US 2023/0350310 A1    Nov. 2, 2023

(30) Foreign Application Priority Data

Apr. 29, 2022   (CN) .......................... 202210472511.8

(51) Int. Cl.
*G03F 7/00*   (2006.01)
*H01L 23/544*  (2006.01)

(52) U.S. Cl.
CPC ...... *G03F 7/70633* (2013.01); *G03F 7/70625* (2013.01); *G03F 7/70683* (2013.01); *H01L 23/544* (2013.01); *H01L 2223/54426* (2013.01)

(58) Field of Classification Search
CPC ......... H01L 23/544; H01L 2223/54426; G03F 7/70633
See application file for complete search history.

(56) References Cited

U.S. PATENT DOCUMENTS

| | | | |
|---|---|---|---|
| 6,580,505 B1* | 6/2003 | Bareket | G03F 7/70633 430/22 |
| 7,065,737 B2* | 6/2006 | Phan | H01L 22/34 430/30 |
| 7,408,642 B1* | 8/2008 | DiBiase | G03F 7/70633 356/399 |
| 7,998,826 B2* | 8/2011 | Yang | G03F 7/70633 257/E23.179 |

* cited by examiner

*Primary Examiner* — David A Zarneke
(74) *Attorney, Agent, or Firm* — Winston Hsu

(57) ABSTRACT

An overlay mark includes a bottom overlay mark on a bottom level, a middle overlay mark on a middle level, and a top overlay mark on a top level. The bottom overlay mark, the middle overlay mark and the top overlay mark vertically overlap with one another.

16 Claims, 4 Drawing Sheets

OVERLAY MARK

BACKGROUND OF THE INVENTION

1. Field of the Invention

The present invention relates to the field of semiconductor technology, and more particularly, to an improved diffraction-based overlay mark.

2. Description of the Prior Art

The measurement of overlay error between successive patterned layers on a wafer is one of the most critical process control techniques used in the manufacturing of integrated circuits and devices. Overlay accuracy generally pertains to the determination of how accurately a first patterned layer aligns with respect to a second patterned layer disposed above or below it and to the determination of how accurately a first pattern aligns with respect to a second pattern disposed on the same layer.

Typically, overlay measurements are performed via test patterns that are printed together with layers of the wafer. The images of these test patterns are captured via an imaging tool and an analysis algorithm is used to calculate the relative displacement of the patterns from the captured images. In the current metal process, the overlay measurement of the via layer is done by measuring the two juxtaposed current-layer marks respectively to the two previous layer marks, for example, the upper metal layer mark and the lower metal layer mark. The prior art overlay mark not only occupies a larger area of the scribe lane, but also increases the burden of the measurement work.

SUMMARY OF THE INVENTION

It is one object of the present invention to provide an improved overlay mark in order to solve the above-mentioned deficiencies or shortcomings of the prior art.

One aspect of the invention provides an overlay mark including a bottom overlay mark on a bottom level, a middle overlay mark on a middle level, and a top overlay mark on a top level. The bottom overlay mark, the middle overlay mark and the top overlay mark vertically overlap with one another. The top overlay mark comprises a plurality of top periodic line patterns distributed in four inner working zones and four outer working zones spatially separated from one another. The middle overlay mark comprises a plurality of middle periodic line patterns distributed in four working zones vertically overlapping with the four inner working zones of the top overlay mark. The bottom overlay mark comprises a plurality of bottom periodic line patterns distributed in four working zones vertically overlapping with the four outer working zones of the top overlay mark.

According to some embodiments, the bottom overlay mark, the middle overlay mark, and the top overlay mark are rectangular shaped and have substantially the same length and width.

According to some embodiments, the bottom overlay mark, the middle overlay mark and the top overlay mark have a square shape and a dimension of 22 μm×22 μm.

According to some embodiments, the four inner working zones and the four outer working zones constitute eight rectangular-shaped working zones, which are grouped into four cells comprising a first cell and a third cell disposed diagonally opposite to the first cell, and a second cell and a fourth cell disposed diagonally opposite to the second cell.

According to some embodiments, the first cell and the third cell of the top overlay mark are configured to provide overlay information in a first direction, and the second cell and the fourth cell of the top overlay mark are configured to provide overlay information in a second direction that is orthogonal to the first direction.

According to some embodiments, the top periodic line patterns of the top overlay mark and the middle periodic line patterns of the middle overlay mark constitute a first line-over-line structure used to determine overlay error between the top level and the middle level.

According to some embodiments, the top periodic line patterns of the top overlay mark and the bottom periodic line patterns of the bottom overlay mark constitute a second line-over-line structure used to determine overlay error between the top level and the bottom level.

According to some embodiments, the top overlay mark disposed on the top level comprises a photoresist pattern.

According to some embodiments, the middle overlay mark on the middle level is formed of an interlayer material.

According to some embodiments, the interlayer material comprises a hard mask material.

According to some embodiments, the bottom overlay mark disposed on the bottom level comprises a material different from that of the middle level.

According to some embodiments, the bottom overlay mark is formed of metal or polysilicon.

According to some embodiments, the metal comprises damascened copper.

According to some embodiments, the overlay mark is disposed on a scribe lane and configured to determine relative shift between three successive layers of a wafer.

According to some embodiments, a configuration of the four inner working zones and four outer working zones of the top overlay mark is rotationally symmetric about a center of the overlay mark.

According to some embodiments, the overlay mark is a diffraction-based overlay mark.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
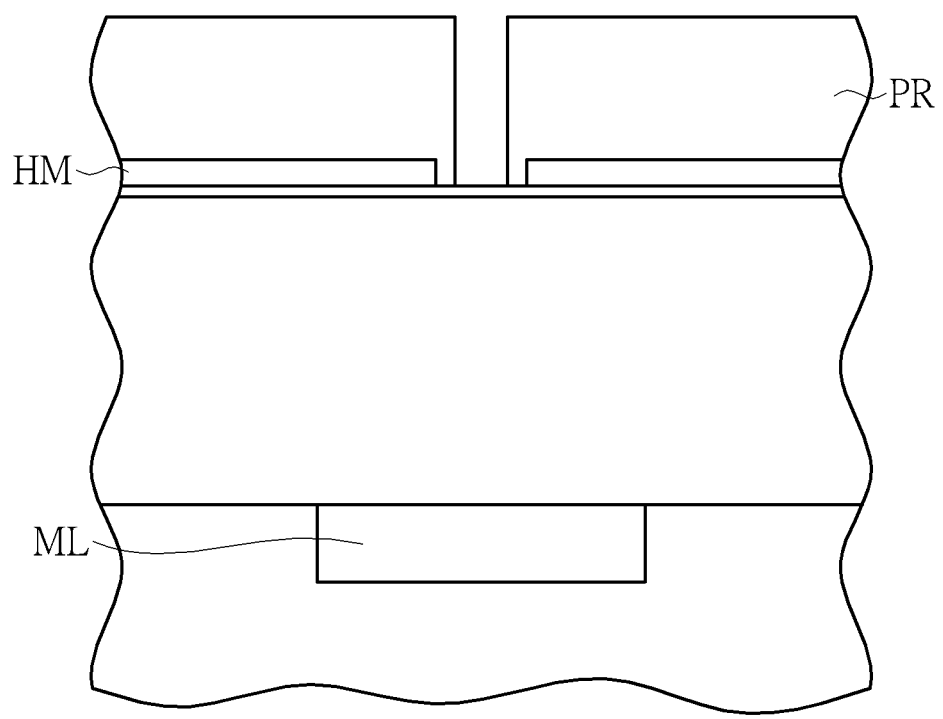
FIG. 1 illustrates an exemplary intermediate structure after the formation of the photoresist pattern that defines a via layer during a dual damascene metal process.

Please refer to FIG. 1, which illustrates the scenario of overlay measurement between a photoresist pattern PR that defines a via layer and a previous layer including a hard mask pattern HM and a lower metal layer ML during the dual damascene metal process. Typically, two juxtaposed current-layer marks each having a size of 16 μm×16 μm are respectively measured with two previous-layer marks, for example, an upper metal layer mark and a lower metal layer mark. However, the prior art overlay design occupies a larger area of the scribe lanes. In addition, since the overlay measurement of the current-layer mark and the upper metal layer mark and the overlay measurement of the current-layer mark and the lower metal layer mark are performed separately, the burden of the measurement work increases.

Figure 2:
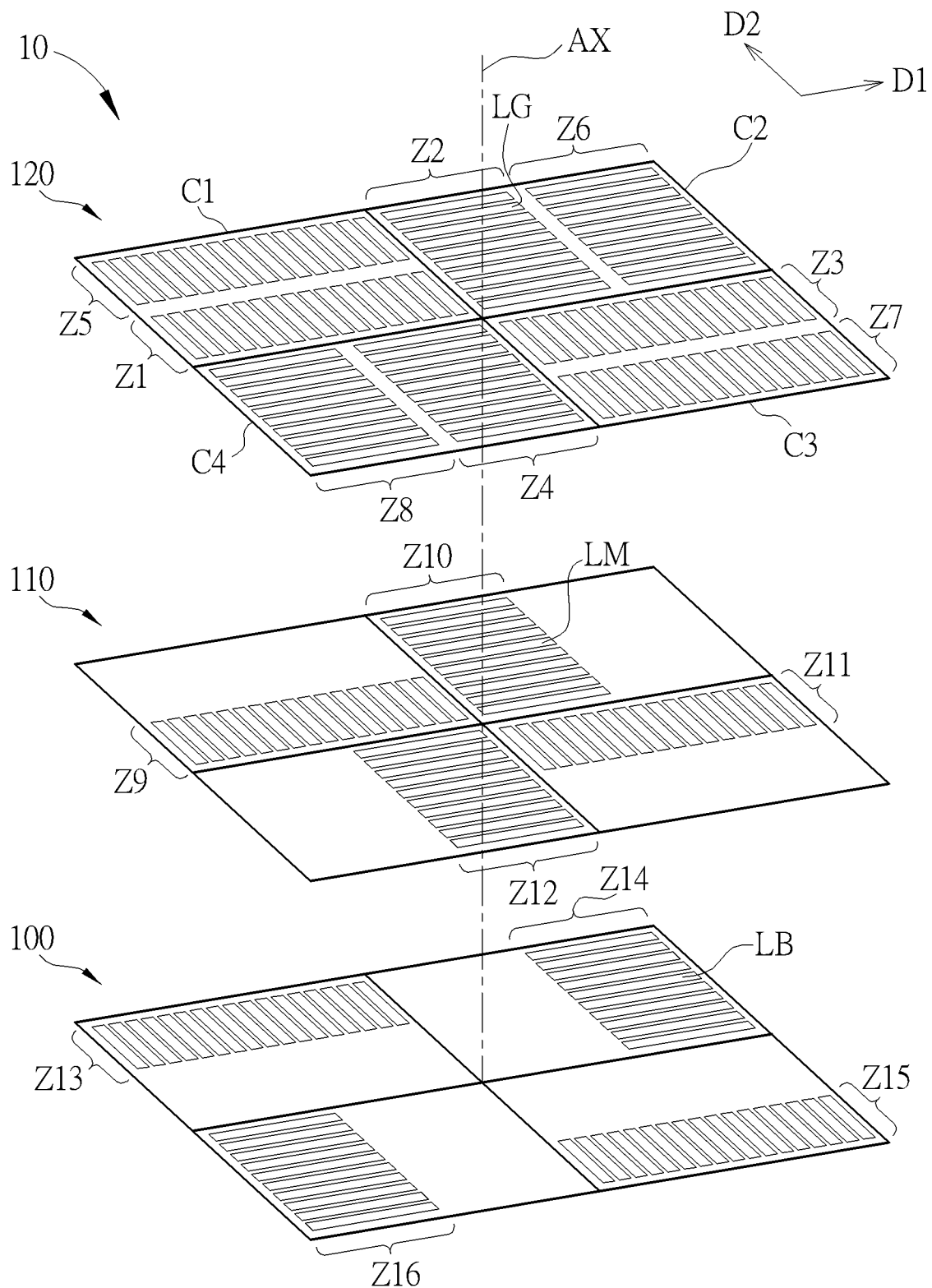
FIG. 2 is a perspective side view of an overlay mark according to an embodiment of the present invention.
Figure 3:
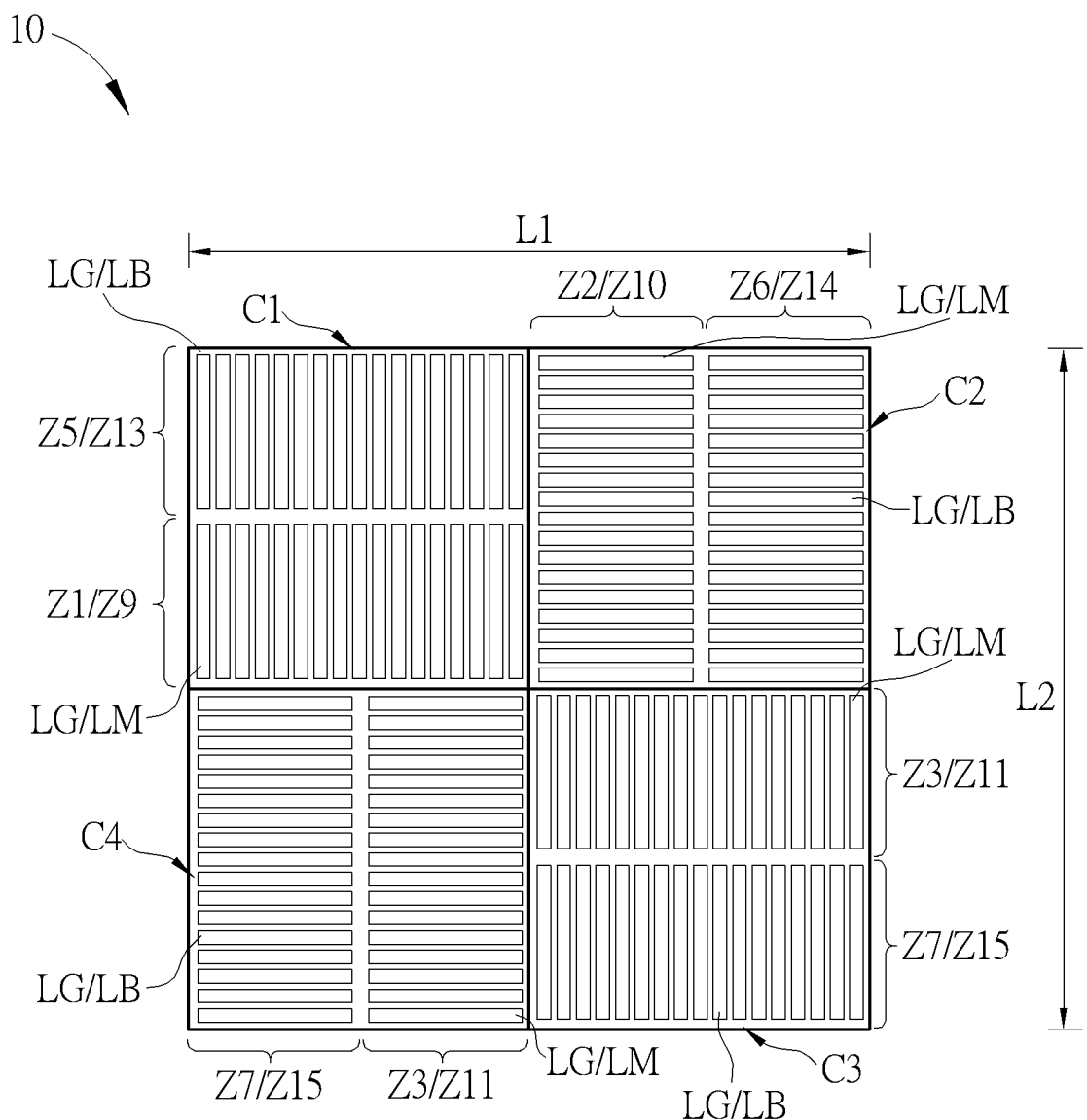
FIG. 3 is a top view of an overlay mark according to an embodiment of the present invention.
Figure 4:
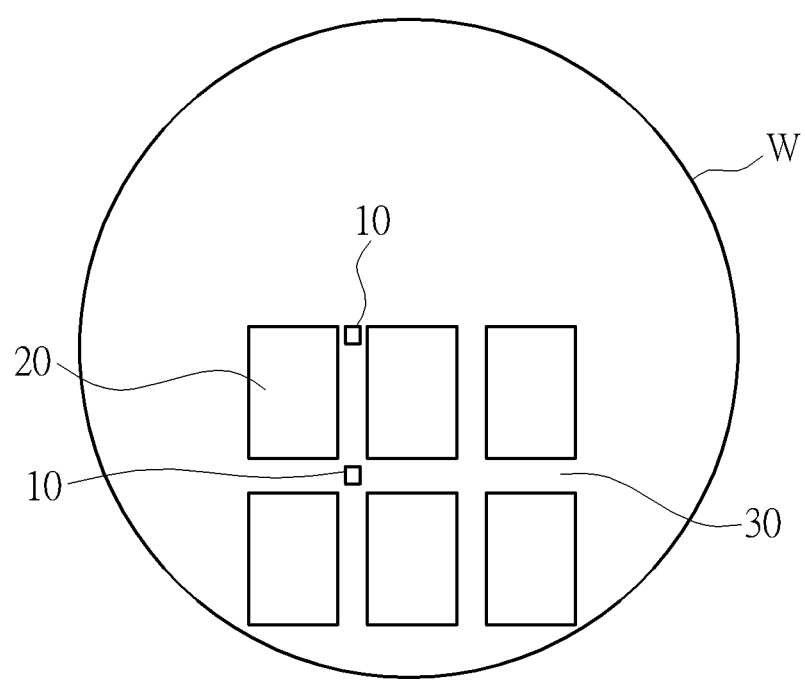
FIG. 4 illustrates the exemplary overlay marks located on scribe lanes of a wafer.

Please refer to FIG. 2 and FIG. 3. FIG. 2 is a perspective side view of an overlay mark according to an embodiment of the present invention. FIG. 3 is a top view of the overlay mark according to an embodiment of the present invention. As shown in FIG. 2 and FIG. 3, the overlay mark 10 includes a bottom overlay mark 100 on the bottom level, a middle overlay mark 110 on the middle level, and a top overlay mark 120 on the top level, The bottom overlay mark 100, the middle overlay mark 120 and the top overlay mark 120 vertically overlap with one another. According to an embodiment of the present invention, as shown in FIG. 4, multiple customer effective pattern areas 20 are provided on the wafer W, and the scribe lanes 30 are located between the customer effective pattern areas 20. Overlay marks 10 are disposed on the scribe lanes 30 for determining relative shift between three successive layers of the wafer W. According to an embodiment of the present invention, the overlay mark 10 is a diffraction-based overlay mark.

According to an embodiment of the present invention, as shown in FIG. 2 and FIG. 3, the top overlay mark 120 includes multiple top periodic line patterns LG, which are distributed in four inner working zones Z1~Z4 and four outer working zones Z5~Z8 that are spatially separated from one another. The middle overlay mark 110 includes multiple middle periodic line patterns LM, which are distributed in the four middle working zones Z9~Z12 and vertically overlap with the four inner working zones Z1~Z4 of the top overlay mark 120, respectively. The bottom overlay mark 100 includes multiple bottom periodic line patterns LB, which are distributed in the four bottom working zones Z13~Z16 and vertically overlap with the four outer working zones Z5~Z8 of the top overlay mark 120, respectively.

According to an embodiment of the present invention, the bottom overlay mark 100, the middle overlay mark 110 and the top overlay mark 120 are all rectangular shaped and have the same length and width, for example, a rectangle with a length and a width denoted with L1 and L2. According to an embodiment of the present invention, for example, the bottom overlay mark 100, the middle overlay mark 110, and the top overlay mark 120 are square shaped, and all have a size of 22 μm×22 μm.

According to an embodiment of the present invention, the four inner working zones Z1~Z4 and the four outer working zones Z5~Z8 constitute eight rectangular working zones, which are grouped into four cells C1—C4, including a first cell C1 and a third cell C3 disposed diagonally opposite to the first cell C1, and a second cell C2 and a fourth cell C4 disposed diagonally opposite to the second cell C2. According to an embodiment of the present invention, a configuration of the four inner working zones Z1~Z4 and the four outer working zones Z5~Z8 of the top overlay mark 120 is rotationally symmetric about a central axis AX of the overlay mark 10.

According to an embodiment of the present invention, the top periodic line patterns LG located in the second cell C2 and the fourth cell C4 extend along the first direction D1, and the top periodic line patterns LG located in the first cell C1 and the third cell C3 extending along the second direction D2. According to an embodiment of the present invention, the first direction D1 is orthogonal to the second direction D2.

According to an embodiment of the present invention, the first cell C1 and the third cell C3 of the top overlay mark 120 are configured to provide overlay information (e.g., shift in the ±x direction) in the first direction D1, and the second cell C2 and the fourth cell C4 of the top overlay mark 120 are configured to provide overlay information (e.g., shift in the ±y direction) in the second direction D2 that is orthogonal to the first direction D1.

According to an embodiment of the present invention, the top periodic line pattern LG of the four inner working zones Z1~Z4 of the top overlay mark 120 and the middle periodic line pattern LM of the four middle working zones Z9~Z12 of the middle overlay mark 110 constitute a first line-over-line structure LG/LM used to determine the overlay error between the top level and the middle level. According to an embodiment of the present invention, the top periodic line patterns LG of the four outer working zones Z5~Z8 of the top overlay mark 120 and the bottom periodic line patterns LB of the four bottom working zones Z13~Z16 of the bottom overlay mark 100 constitute a second line-over-line structure LG/LB used to determine the overlay error between the top level and the bottom level.

According to an embodiment of the present invention, the top overlay mark 120 disposed on the top level includes a photoresist pattern (formed concurrently with the photoresist pattern PR in FIG. 1). According to an embodiment of the present invention, the middle overlay mark 110 disposed on the middle level is formed of an interlayer material. According to an embodiment of the present invention, the interlayer material includes a hard mask material (formed concurrently with the hard mask pattern HM in FIG. 1). According to an embodiment of the present invention, the bottom overlay mark 100 disposed on the bottom level comprises a different material from that of the middle level. According to an embodiment of the present invention, for example, the bottom overlay mark 100 is formed of metal or polysilicon. According to an embodiment of the present invention, the metal comprises damascened copper (formed concurrently with the lower metal layer ML in FIG. 1).

One advantage of the present invention is that the conventional two juxtaposed current-layer marks, which are both 16 μm×16 μm in size, are integrated into a single mark with a size of 22 μm×22 μm, by partitioning the four cells C1—C4 of the top overlay mark 120 into a total of eight rectangular working zones including four inner working zones Z1~Z4 and four outer working zones Z5~Z8. The four inner working zones Z1~Z4 and four outer working zones Z5~Z8 vertically overlap the four middle working zones Z9~Z12 of the bottom overlay mark 100 and the four bottom work zones Z13~Z16 of the middle overlay mark 110, respectively, whereby the overlay information between the top level and the middle level and the overlay information between the top level and the bottom level can be obtained at the same time by implementing a single measurement. Therefore, the present invention can not only reduce the area of the scribe lanes occupied by the overlay marks, but also improve the working efficiency of the overlay measurement.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An overlay mark comprising:
   a bottom overlay mark on a bottom level, a middle overlay mark on a middle level, and a top overlay mark on a top level, wherein the bottom overlay mark, the middle overlay mark and the top overlay mark vertically overlap with one another;
   wherein the top overlay mark comprises a plurality of top periodic line patterns distributed in four inner working zones and four outer working zones spatially separated from one another;
   wherein the middle overlay mark comprises a plurality of middle periodic line patterns distributed in four working zones vertically overlapping with the four inner working zones of the top overlay mark;
   wherein the bottom overlay mark comprises a plurality of bottom periodic line patterns distributed in four working zones vertically overlapping with the four outer working zones of the top overlay mark.

2. The overlay mark according to claim 1, wherein the bottom overlay mark, the middle overlay mark, and the top overlay mark are rectangular shaped and have substantially the same length and width.

3. The overlay mark according to claim 1, wherein the bottom overlay mark, the middle overlay mark and the top overlay mark have a square shape and a dimension of 22 µm×22 µm.

4. The overlay mark according to claim 1, wherein the four inner working zones and the four outer working zones constitute eight rectangular-shaped working zones, which are grouped into four cells comprising a first cell and a third cell disposed diagonally opposite to the first cell, and a second cell and a fourth cell disposed diagonally opposite to the second cell.

5. The overlay mark according to claim 4, wherein the first cell and the third cell of the top overlay mark are configured to provide overlay information in a first direction, and the second cell and the fourth cell of the top overlay mark are configured to provide overlay information in a second direction that is orthogonal to the first direction.

6. The overlay mark according to claim 1, wherein the top periodic line patterns of the top overlay mark and the middle periodic line patterns of the middle overlay mark constitute a first line-over-line structure used to determine overlay error between the top level and the middle level.

7. The overlay mark according to claim 6, wherein the top periodic line patterns of the top overlay mark and the bottom periodic line patterns of the bottom overlay mark constitute a second line-over-line structure used to determine overlay error between the top level and the bottom level.

8. The overlay mark according to claim 1, wherein the top overlay mark disposed on the top level comprises a photoresist pattern.

9. The overlay mark according to claim 1, wherein the middle overlay mark on the middle level is formed of an interlayer material.

10. The overlay mark according to claim 9, wherein the interlayer material comprises a hard mask material.

11. The overlay mark according to claim 1, wherein the bottom overlay mark disposed on the bottom level comprises a material different from that of the middle level.

12. The overlay mark according to claim 11, wherein the bottom overlay mark is formed of metal or polysilicon.

13. The overlay mark according to claim 12, wherein the metal comprises damascened copper.

14. The overlay mark according to claim 1, wherein the overlay mark is disposed on a scribe lane and configured to determine relative shift between three successive layers of a wafer.

15. The overlay mark according to claim 1, wherein a configuration of the four inner working zones and four outer working zones of the top overlay mark is rotationally symmetric about a center of the overlay mark.

16. The overlay mark according to claim 1, wherein the overlay mark is a diffraction-based overlay mark.

* * * * *